(12) United States Patent
Rodriguez

(10) Patent No.: US 8,656,985 B2
(45) Date of Patent: Feb. 25, 2014

(54) RACKMOUNT REAR DOOR HEAT EXCHANGER

(75) Inventor: Jean-Michel Rodriguez, Montpellier (FR)

(73) Assignee: International Business Machines Corporation, Armonk, NY (US)

( * ) Notice: Subject to any disclaimer, the term of this patent is extended or adjusted under 35 U.S.C. 154(b) by 957 days.

(21) Appl. No.: 12/254,121

(22) Filed: Oct. 20, 2008

(65) Prior Publication Data
US 2010/0078150 A1    Apr. 1, 2010

(30) Foreign Application Priority Data
Sep. 30, 2008 (EP) .................................... 08305622

(51) Int. Cl.
*G06F 1/20* (2006.01)
*H05K 5/00* (2006.01)
*F28F 7/00* (2006.01)
*F28F 27/02* (2006.01)

(52) U.S. Cl.
USPC ..... 165/80.2; 165/100; 165/101; 361/679.49; 361/724

(58) Field of Classification Search
USPC ................ 165/80.2, 80.3, 80.4, 96, 100, 101; 361/688, 689, 698, 724
See application file for complete search history.

(56) References Cited

U.S. PATENT DOCUMENTS

| | | | | |
|---|---|---|---|---|
| 3,481,393 A | * | 12/1969 | Chu .............................. | 165/80.4 |
| 5,467,250 A | * | 11/1995 | Howard et al. ................ | 361/696 |
| 5,743,102 A | * | 4/1998 | Thomas et al. ................. | 62/185 |
| 6,462,944 B1 | * | 10/2002 | Lin .............................. | 361/679.5 |
| 6,742,583 B2 | * | 6/2004 | Tikka ............................ | 165/291 |
| 6,745,579 B2 | * | 6/2004 | Spinazzola et al. ............... | 62/89 |
| 6,819,563 B1 | * | 11/2004 | Chu et al. ...................... | 361/696 |
| 7,259,963 B2 | * | 8/2007 | Germagian et al. .......... | 361/695 |
| 7,315,448 B1 | * | 1/2008 | Bash et al. ..................... | 361/701 |
| 7,355,852 B2 | | 4/2008 | Pfahnl | |
| 7,534,167 B2 | * | 5/2009 | Day .............................. | 454/187 |
| 7,679,909 B2 | * | 3/2010 | Spearing et al. .............. | 361/699 |
| 8,047,904 B2 | * | 11/2011 | Yates et al. .................... | 454/118 |
| 2003/0147216 A1 | * | 8/2003 | Patel et al. ..................... | 361/700 |
| 2004/0100770 A1 | * | 5/2004 | Chu et al. ...................... | 361/698 |
| 2007/0297136 A1 | | 12/2007 | Konshak | |
| 2008/0037217 A1 | * | 2/2008 | Murakami et al. ............ | 361/695 |
| 2009/0107652 A1 | * | 4/2009 | VanGilder et al. ........... | 165/80.2 |

FOREIGN PATENT DOCUMENTS

| | | |
|---|---|---|
| EP | 1298975 A2 | 4/2003 |
| EP | 1844637 B1 | 12/2008 |
| WO | WO9734454 | 9/1997 |

* cited by examiner

*Primary Examiner* — Allen Flanigan
*Assistant Examiner* — Jason Thompson
(74) *Attorney, Agent, or Firm* — Cantor Colburn LLP; Steven Bennett

(57) ABSTRACT

A heat exchange apparatus is provided and includes an external structure to support an airflow cooled computing device, first and second doors, each of which includes a heat transfer surface, sequentially coupled to the external structure downstream from the computing device, a water supply system fluidly coupled to a water supply and to the heat transfer surfaces of the first and second doors to thereby supply water to the heat transfer surfaces, first and second valves coupled to the water supply system for association with the first and second doors, respectively, and an exhaust system, disposed proximate to the external structure, configured to recycle the cooled airflow downstream from the first and second doors for repeated cooling of the computing device.

18 Claims, 3 Drawing Sheets

RACKMOUNT REAR DOOR HEAT EXCHANGER

CLAIM OF PRIORITY

This application claims priority to European Patent Application No. EP08305622, filed Sep. 30, 2008 and incorporated by reference herein in its entirety.

BACKGROUND

Aspects of the present invention are directed to a rackmount and, more particularly, to a rackmount rear door heat exchanger apparatus.

Rackmounts are typically employed in the information technology (IT) industry to support servers or similar computing devices in an easily accessible space. The servers generally run substantially continuously or nearly so in order to, e.g., support a network of other computers. In this capacity, the servers generate a significant amount of heat, even during normal operations, which must be removed or otherwise dissipated to thereby prevent the servers from overheating and either suffering from diminished performance or failing altogether.

In general, the removal/dissipation of heat has been accomplished by the generation of a cooling airflow over the servers. While this solution is effective at removing/dissipating heat, it is power and energy expensive. A further solution, then, has been to recycle the air from the airflow. In this solution, however, it is seen that it is necessary to cool the air prior to recycling it as the air is heated by the servers during the cooling.

The problem of cooling the air prior to the recycling has been addressed by the use of rear door heat exchangers disposed within the airflow of the rackmounts. However, while rear door heat exchangers are effective at cooling the air prior to recycling, rear door heat exchangers also typically have a single point of failure, that requires frequent and expensive service to fix during which, at least, the airflow and, oftentimes, the servers themselves must be shut down.

SUMMARY

In accordance with an aspect of the invention, a rackmount rear door heat exchange apparatus is provided and includes an external structure, supportive of a computing device, through which an airflow for cooling the computing device is generated, first and second doors sequentially coupled to the external structure downstream from the computing device such that the airflow flows over the first and, subsequently, the second door, a water supply system fluidly coupled to a water supply and to the first and second doors to thereby supply water to the first and second doors by which the airflow is cooled, first and second valves coupled to the water supply system for association with the first and second doors, respectively, each valve being configured to close and to thereby block a supply of water to the associated door during service of the associated door, and an exhaust system, disposed proximate to the external structure, configured to recycle the cooled airflow downstream from the first and second doors for repeated cooling of the computing device.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

Figure 1:
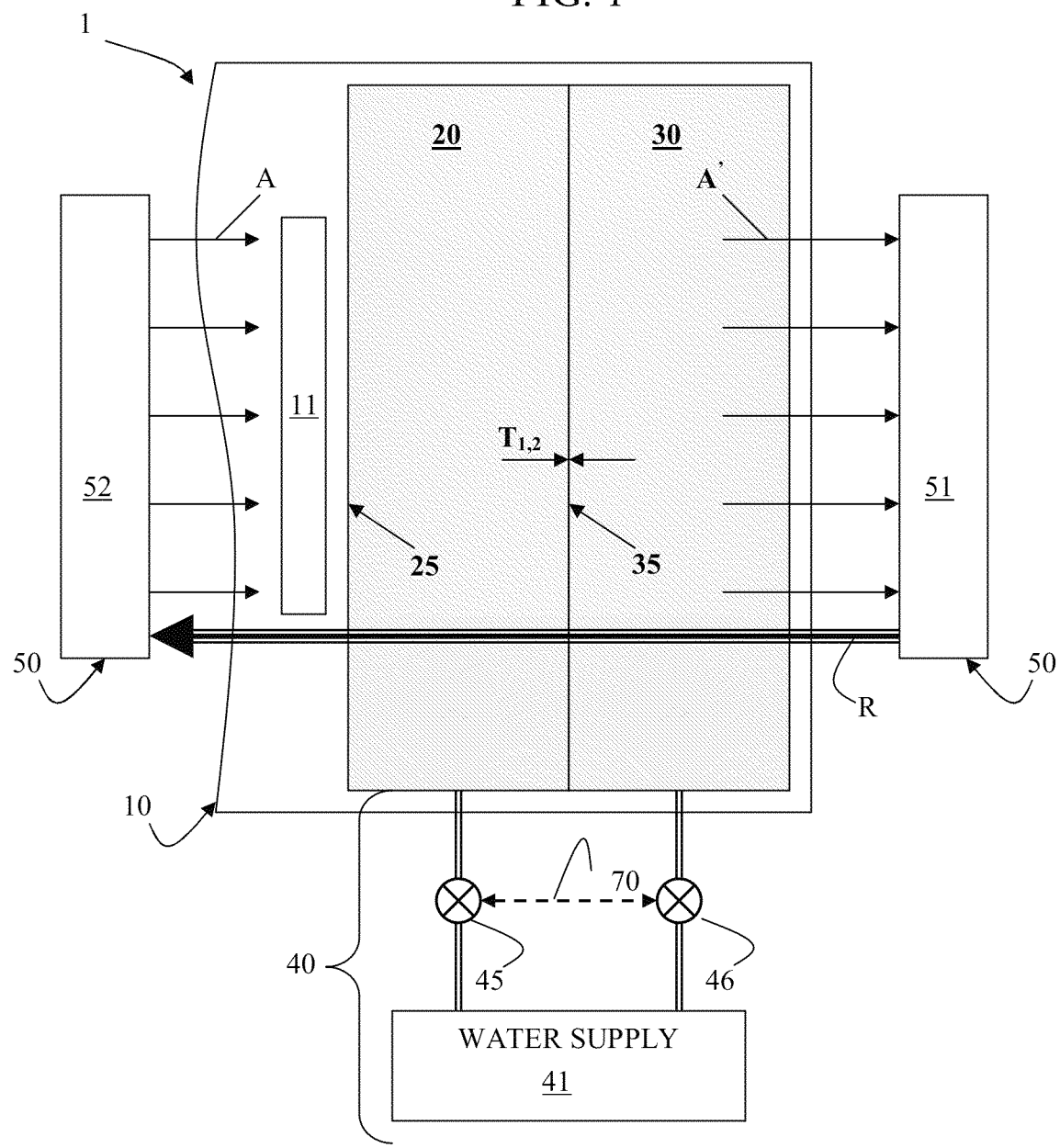
FIG. 1 is a schematic diagram of an exemplary rackmount rear door heat exchange apparatus in accordance with embodiments of the present invention.

With reference to FIG. 1, a rackmount rear door heat exchange apparatus 1 is provided that does not have a single point of failure and which can be serviced with an airflow (designated by "A" in FIG. 1) running and a computing device to be cooled by the airflow A fully operational. The apparatus 1 includes an external structure 10 having a form and shape of a rackmount structure with a base, vertical supports and one or more sets of supporting devices, such as plates, hooks, or brackets, on which one or more computing devices, such as servers, are placed for support. With this configuration, the external structure 10 is configured to support a computing device 11 and allows for operator access to, in particular, the front and back faces of the computing device 11. In this way, when the computing device 11 (which may be a server or another similar computer) requires service, the external structure 10 allows for the computing device 11 to be positioned to be simply and relatively easily accessed and/or connected/disconnected to/from a network.

The external structure 10 is additionally configured to define a pathway through which airflow A, which is generated by an exhaust system 50 to be described below, travels. The airflow A cools the computing device 11, in particular, during operations thereof which tend to generate heat that would otherwise lead to malfunction or diminished performance of the computing device 11. Of course, it is seen that in cooling the computing device 11, a temperature of the airflow A increases as the airflow A passes over the computing device 11. In fact, in accordance with embodiments of the invention, the airflow A may have an initial temperature of about 23° Celsius and a post-heating temperature of about 50° Celsius.

In accordance with various aspects of the present invention, at least, first and second doors 20 and 30 are provided along the airflow A to at least partially cool the airflow A from the post-heating temperature described above.

In detail, as shown in FIG. 1, the first and second doors 20 and 30 are sequentially coupled to the external structure 10 downstream from the computing device 11. That is, the first and second doors 20 and 30 are generally disposed in a rear of the external structure and sequentially downstream from the computing device 11, although it is understood that this is not required. In this position, the first and second doors 20 and 30 may be connected to the external structure and/or to one another in an abutting relationship, in which space $T_1$ between the first and second doors 20 and 30 is minimal or non-existent, or a non-abutting relationship, in which a space $T_2$ between the first and second doors 20 and 30 is provided, in known manners that allow for the first and second doors 20 and 30 to be opened or closed. For example, the first and second doors 20 and 30 may be connected to the external structure 10 by first and second hinges 25 and 35, respectively, such that the first and second doors open by rotating about the first and second hinges 25 and 35.

In any case, the arrangement of the first and second doors 20 and 30 with respect to the external structure 10 is provided such that the airflow A flows over the first door 20 and, subsequently, the second door 30. More specifically, the airflow A flows over heat transfer surfaces of the first door 20 and, subsequently, heat transfer surfaces of the second door 30.

A water supply system 40 is provided and is fluidly coupled to a water supply 41, such as an external water supply or a local reservoir, and to each of the first and second doors 20 and 30. In this way, the water supply system 40 is configured to supply water to the first and second doors 20 and 30. More particularly, the water supply system 40 is configured provide the water to the heat transfer surfaces of the first and second doors 20 and 30. The provision of the water to the first and second doors 20 and 30 and/or the heat transfer surfaces thereof cools the airflow A as the airflow A continues to flow over the first and second doors 20 and 30.

First and second valves 45 and 46 are disposed proximate to or within the water supply system 40 and are operably coupled to the water supply system 40 for association with the first and second doors 20 and 30, respectively. Each valve 45 and 46 operates in either an open or a closed position. In their open positions, the first valve 45 allows water to be supplied to the first door 20 and the second valve 46 allows water to be supplied to the second door 30. Conversely, in their closed positions, the first valve 45 prevents water from being supplied to the first door 20 and the second valve 46 prevents water from being supplied to the second door 30.

In accordance with an embodiment of the invention, the first and second valves 45 and 46 are opened when the first and second doors 20 and 30 are installed and operable. However, when the first and second doors 20 and 30 are inoperable due to being, e.g., removed for service, the first and second valves 45 and 46 are closed. Here, it is understood that the valves 45 and 46 may be configured to automatically close with the corresponding one of the first and second doors 20 and 30 removed for service or, alternately, that the valves 45 and 46 may each be manually closed prior to the removal of the corresponding one of the first and second doors 20 and 30.

The exhaust system 50, as mentioned above, is disposed proximate to the external structure 10 and is configured to recycle the cooled airflow A downstream from the first and second doors 20 and 30 for repeated cooling of the computing device 11. In this way, the exhaust system 50 includes an airflow receiving unit 51 and an airflow generating unit 52 that are coupled to one another such that recycled airflow R is transferred upstream from the computing device 11.

In accordance with the embodiments of the invention described above, it is seen that the second door 30 provides for redundant (2n) airflow A cooling. As such, if the first door 20 or any component thereof should fail, the second door 30 is available to maintain at least partial cooling of the airflow A and vice versa. In addition, the availability of the operable one of the first and second doors 20 and 30 is independent of the servicing of the other and may be employed to at least partially cool the airflow A during the service of the other door. To this end, in accordance with further embodiments of the invention, it is understood that the second door 30 may be plural in number with each second door 30 providing additional redundant (2n+1, 2, 3, . . . , n) cooling.

Still referring to FIG. 1, when one of the valves 45 and 46 closes, the water supply for the one of the first and second doors 20 and 30 associated with the closed valve 45 and 46 may be diverted to the other door. This diversion may be provided along line 70 by which valves 45 and 46 may be coupled to one another. Here, where the water supply is diverted from one of the first and second doors 20 and 30 to the other, the water supply system 40 is further configured to accordingly increase or decrease a volume of the supplied water based on a number of the first and second doors 20 and 30 being currently serviced.

Figure 2:
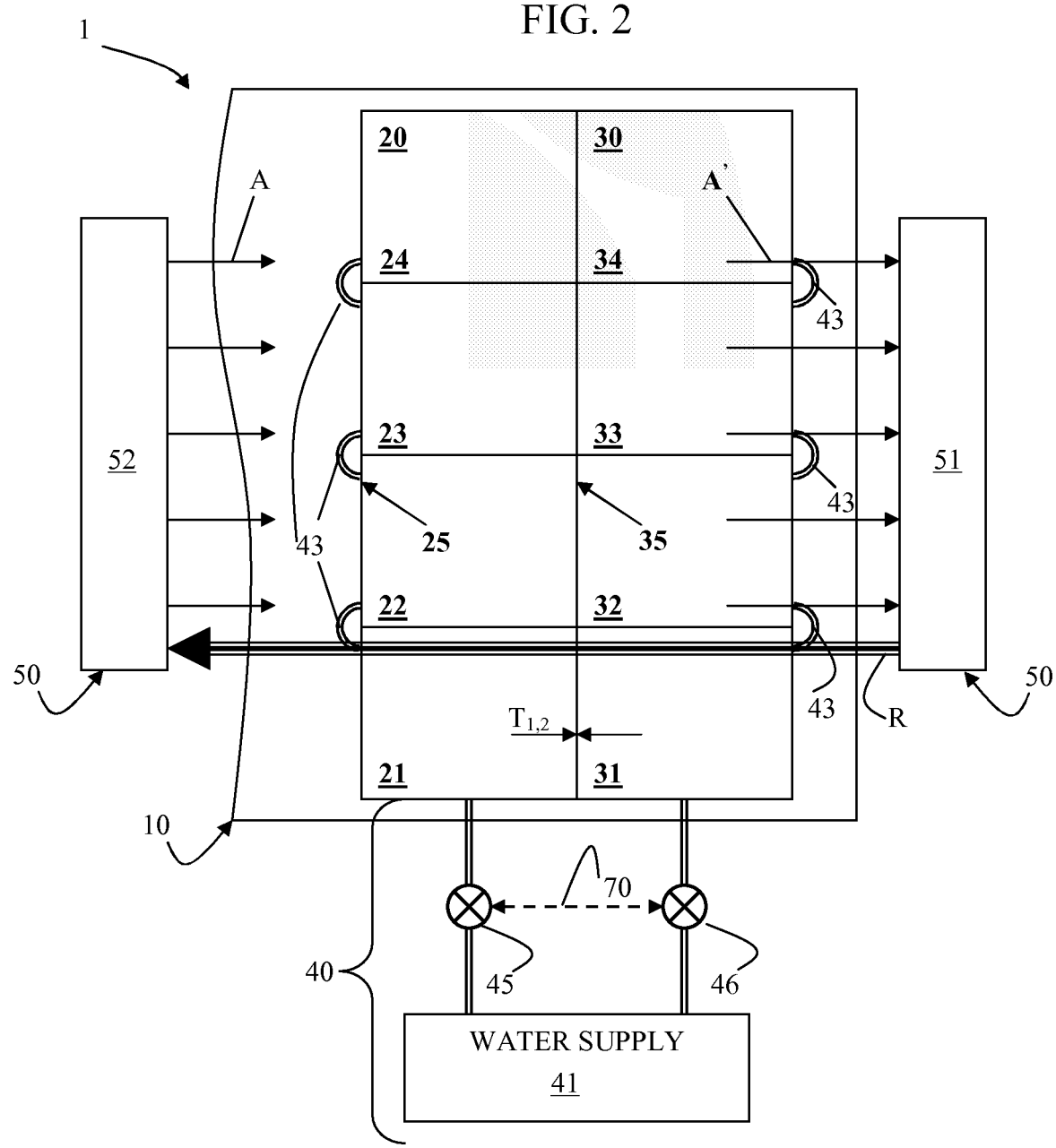
FIG. 2 is a schematic diagram of an exemplary rackmount rear door heat exchange apparatus in accordance with further embodiments of the present invention.
Figure 3:
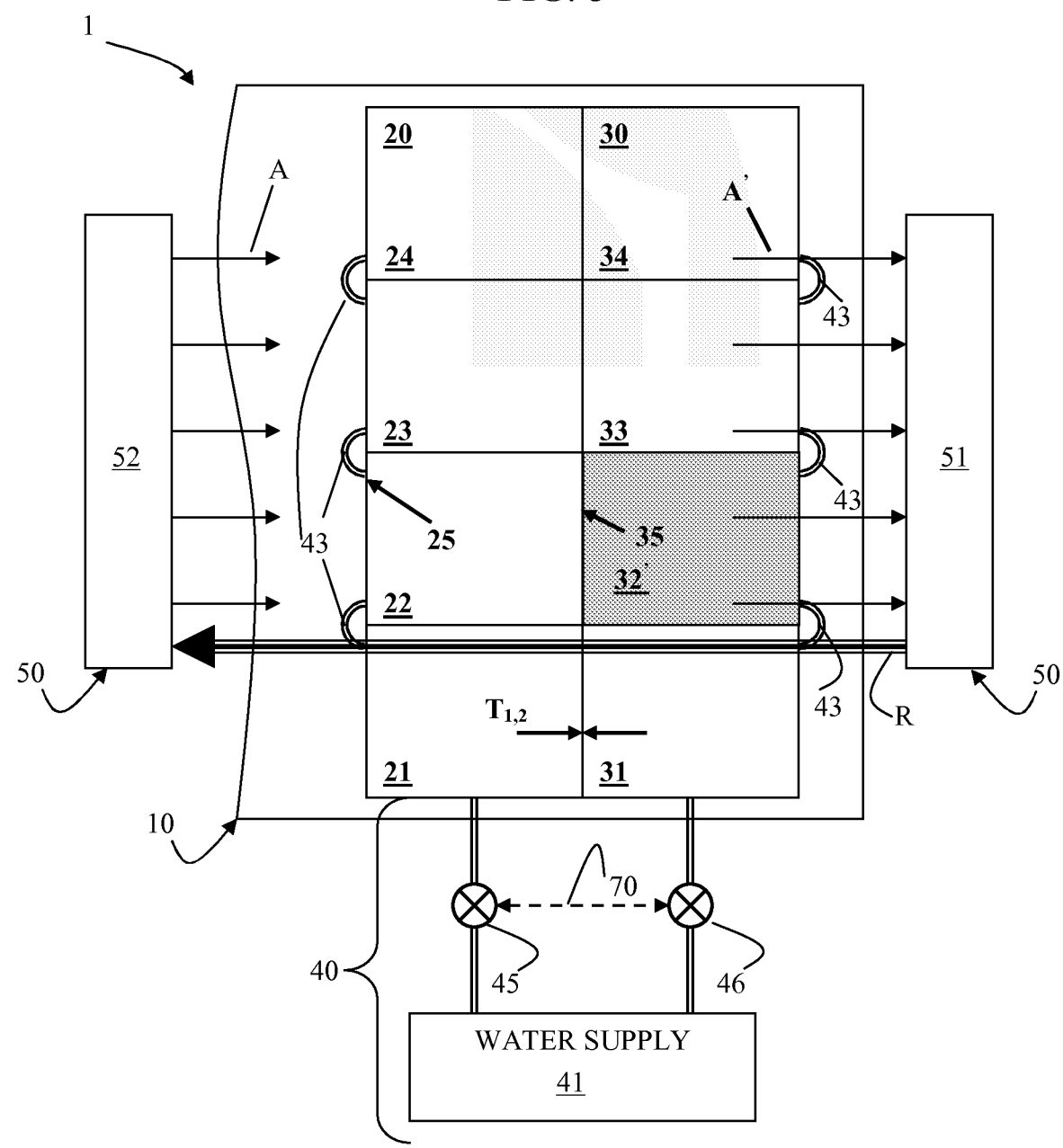
FIG. 3 is a schematic diagram of an exemplary rackmount rear door heat exchange apparatus in accordance with still further embodiments of the present invention.

With reference to FIGS. 2 and 3, further embodiments of the invention are illustrated in which the first door 20 includes panels 21-24 and the second door 30 includes panels 31-34. Here, each of the panels 21-24 and 31-34 are receptive of a portion of the water supply of the corresponding one of the first and second doors 20 and 30, respectively, and, again, may abut one another ($T_1$) or may be spaced from one another ($T_2$).

In accordance with alternate embodiments of the invention, the one or more panels 21-24 and 31-34 of each of the first and second doors 20 and 30, respectively, are receptive of the respective water supplies in parallel or are serially receptive of the respective water supplies by way of piping 43. Where the panels 21-24 and 31-34 are serially receptive of the respective water supplies, the respective water supplies to a leading panel of the series and any following panels in the series are automatically or manually blocked during service of the leading panel. Alternately, as shown in FIG. 3, a panel being serviced may be replaced by a dummy panel 32', in which case the respective water supplies to any following panels may be maintained. In still another alternate embodiment, the piping 43 may be configured to automatically divert water supplies away form a panel being serviced and toward an operable panel. In any case, as before, the water supply system 40 may be configured to increase or decrease a volume of the supplied water based on a number of panels being serviced.

In accordance with another aspect of the invention, a method of operating a rackmount rear door heat exchange apparatus is provided. The method includes supplying water by way of the water supply system 40 to the first and second doors 20 and 30 and/or paneling 21-24 and 31-34 thereof by which the airflow A is cooled, in an event a door 20 or 30 or a panel 21-24 or 31-34 requires service, preventing the supply of the water to the door 20 or 30 or the panel 21-24 or 31-34 and/or diverting the supply of the water to the other door 20 or 30 or other panel 21-24 or 31-34, servicing the door 20 or 30 or the panel 21-24 or 31-34 with the supply of the water prevented and/or diverted, and, upon a conclusion of the servicing, resuming the supplying of the water and/or ending the diversion of the supply of the water.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. A rackmount rear door heat exchange apparatus, comprising:

an external structure, supportive of a computing device, through which an airflow for cooling the computing device is generated;

first and second doors sequentially coupled to the external structure downstream from the computing device such that the that first door is disposed in an intervening position between the computing device and the second door and fluidly interposed between the computing device and the second door such that the airflow flows over the computing device, the first door and, subsequently, the second door;

a water supply system fluidly coupled to a water supply and to the first and second doors to thereby supply water to the first and second doors by which the airflow is cooled;

first and second valves coupled to the water supply system for association with the first and second doors, respectively, each valve being configured to close and to thereby block a supply of water to the associated door during service of the associated door; and an exhaust system, disposed proximate to the external structure, configured to recycle the cooled airflow downstream from the second door and to transfer the cooled airflow upstream from the computing device for repeated cooling of the computing device the exhaust system being configured to transfer recycled airflow upstream from the computing device and comprising:

an airflow receiving unit disposed downstream from the second door; and an airflow generating unit disposed upstream from the computing device such that:

the second door is disposed in an intervening position between the first door and the airflow receiving unit, the computing device is disposed in an intervening position between the airflow generating unit and the first door, and Where the airflow flows in a linear direction from the airflow generating unit, over the first door, over the second door, and then to the airflow receiving unit.

2. The apparatus according to claim 1, wherein the second door provides for redundant airflow cooling.

3. The apparatus according to claim 1, wherein the second door is plural in number and each of the plural second doors provides for redundant airflow cooling.

4. The apparatus according to claim 1, wherein, when one of the valves closes, the water supply is diverted to the door associated with the other valve.

5. The apparatus according to claim 1, wherein the first and second doors abut one another.

6. The apparatus according to claim 1, wherein the first and second doors are adjacent with and spaced from one another.

7. The apparatus according to claim 1, wherein the water supply system increases or decreases a volume of the supplied water based on a number of doors being serviced.

8. The apparatus according to claim 1, wherein the first and second doors each comprise one or more panels which are each receptive of a portion of the water supply of the corresponding door.

9. The apparatus according to claim 8, wherein the one or more panels of each door abut one another.

10. The apparatus according to claim 8, wherein the one or more panels of each door are adjacent with and spaced from one another.

11. The apparatus according to claim 8, wherein the one or more panels of each door are serially receptive of the respective water supplies.

12. The apparatus according to claim 11, wherein the respective water supplies to a leading panel and any following panels are blocked during service of the leading panel.

13. The apparatus according to claim 12, wherein the respective water supplies to the following panels are maintained when the leading panel is replaced by a dummy panel.

14. The apparatus according to claim 11, wherein, during service of a leading panel, the respective water supplies to any following panels are maintained.

15. The apparatus according to claim 8, wherein the one or more panels of each door are receptive of the respective water supplies in parallel.

16. The apparatus according to claim 8, wherein the water supply system increases or decreases a volume of the supplied water based on a number of panels being serviced.

17. A rackmount rear door heat exchange apparatus, comprising:

an external structure, supportive of a computing device, through which an airflow for cooling the computing device is generated;

first and second doors coupled to the external structure such that the that first door is disposed in an intervening position between the computing device and the second door and fluidly interposed between the computing device and the second door such that the airflow flows over the computing device, the first door and, subsequently, the second door;

a water supply system fluidly to supply water to the first and second doors for cooling the airflow;

valves configured to block a supply of the water to the first and second doors during service; and an exhaust system configured to recycle cooled airflow from the second door to the computing device, the exhaust system being configured to transfer recycled airflow upstream from the computing device and comprising:

an airflow receiving unit disposed downstream from the second door; and an airflow generating unit disposed upstream from the computing device such that:

the second door is disposed in an intervening position between the first door and the airflow receiving unit, the computing device is disposed in an intervening position between the airflow generating unit and the first door, and Where the airflow flows in a linear direction from the airflow generating unit, over the first door, over the second door, and then to the airflow receiving unit.

18. The apparatus according to claim 1, wherein the single structural direction is defined as being substantially perpendicular to a direction along which the water supply system supplies water to the first and second doors.

* * * * *